(12) United States Patent
Choi et al.

(10) Patent No.: US 11,869,871 B2
(45) Date of Patent: Jan. 9, 2024

(54) APPARATUS AND METHOD FOR SELF-ASSEMBLING SEMICONDUCTOR LIGHT-EMITTING DEVICE

(71) Applicant: LG ELECTRONICS INC., Seoul (KR)

(72) Inventors: Juchan Choi, Seoul (KR); Jideok Kim, Seoul (KR); Bongchu Shim, Seoul (KR); Seulbitna Lee, Seoul (KR); Kiseong Jeon, Seoul (KR); Hyunwoo Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 267 days.

(21) Appl. No.: 17/286,844

(22) PCT Filed: Oct. 8, 2019

(86) PCT No.: PCT/KR2019/013158
§ 371 (c)(1),
(2) Date: Apr. 20, 2021

(87) PCT Pub. No.: WO2020/085677
PCT Pub. Date: Apr. 30, 2020

(65) Prior Publication Data
US 2021/0351158 A1 Nov. 11, 2021

(30) Foreign Application Priority Data

Oct. 25, 2018 (KR) .................. 10-2018-0128474

(51) Int. Cl.
H01L 23/00 (2006.01)
H01L 21/67 (2006.01)
H01L 25/075 (2006.01)

(52) U.S. Cl.
CPC ........ *H01L 24/95* (2013.01); *H01L 21/67121* (2013.01); *H01L 25/0753* (2013.01); *H01L 2224/95101* (2013.01)

(58) Field of Classification Search
CPC ............... H01L 24/95; H01L 21/67121; H01L 25/0753; H01L 2224/95101; H01L 25/50;
(Continued)

(56) References Cited

U.S. PATENT DOCUMENTS 9,825,202 B2   11/2017  Schuele et al.
2007/0087472 A1*  4/2007  Huber .................. B81C 1/00007
                                                              438/106
(Continued)

FOREIGN PATENT DOCUMENTS

JP   11-512875 A   11/1999
JP   2011-13043 A   1/2011
(Continued)

*Primary Examiner* — Ermias T Woldegeorgis
(74) *Attorney, Agent, or Firm* — Birch, Stewart, Kolasch & Birch, LLP

(57) ABSTRACT

Discussed is an apparatus for self-assembling semiconductor light-emitting devices, the apparatus including a fluid chamber to accommodate the semiconductor light-emitting devices, each semiconductor light-emitting device having a magnetic body; a magnet to apply a magnetic force to the semiconductor light-emitting devices while an assembly substrate is disposed at an assembly position of the self-assembly apparatus; a power supply to induce formation of an electric field on the assembly substrate to allow the semiconductor light-emitting devices to be seated at a preset positions on the assembly substrate in a process of moving the semiconductor light-emitting devices due to a change in a position of the magnet; and a fluid injector to shoot a fluid to some of the semiconductor light-emitting devices to allow the some of the semiconductor light-emitting devices seated (Continued)

on the assembly substrate to be separated from the assembly substrate.

19 Claims, 16 Drawing Sheets

(58) Field of Classification Search
CPC ....... H01L 2224/95085; H01L 33/0095; H01L 2224/95133; H01L 2924/12041; H01L 2933/0033; H01L 21/67138; H01L 21/67144; H01L 25/167; H01L 33/0093; H01L 33/06; H01L 33/20; H01L 33/30; H01L 33/38; H01L 33/44
See application file for complete search history.

(56) References Cited

U.S. PATENT DOCUMENTS

| | | | | |
|---|---|---|---|---|
| 2009/0294803 | A1* | 12/2009 | Nuzzo | H01L 21/308 438/479 |
| 2018/0029038 | A1* | 2/2018 | Sasaki | G09G 3/006 |

FOREIGN PATENT DOCUMENTS

| | | |
|---|---|---|
| JP | 2018-41876 A | 3/2018 |
| KR | 10-2012-0138805 A | 12/2012 |
| KR | 10-2013-0033450 A | 4/2013 |

* cited by examiner

APPARATUS AND METHOD FOR SELF-ASSEMBLING SEMICONDUCTOR LIGHT-EMITTING DEVICE

CROSS REFERENCE TO RELATED APPLICATIONS

This application is the National Stage filing under 35 U.S.C. 371 of International Application No. PCT/KR2019/013158, filed on Oct. 8, 2019, which claims the benefit of earlier filing date and right of priority to Korean Application No. 10-2018-0128474, filed on Oct. 25, 2018, the contents of all these applications are hereby incorporated by reference in their entirety into the present application.

BACKGROUND

1. Technical Field

The present disclosure relates to a method of manufacturing a display device, and more particularly, to a method and apparatus of self-assembling a semiconductor light-emitting device.

2. Description of the Related Art

In recent years, liquid crystal displays (LCDs), organic light emitting diode (OLED) displays, and micro-LED displays have been competed to implement a large-area display in the field of display technology.

However, there exist problems such as not-so-fast response time, low efficiency of light generated by backlight in case of LCDs, and there exist drawbacks such as short life span, not-so-good yield as well as low efficiency in case of OLEDs.

On the contrary, when semiconductor light-emitting devices (micro-LED (μLED)) having a diameter or a cross sectional area of 100 microns or less are used in a display, the display may provide a very high efficiency because it does not absorb light using a polarizing plate or the like. However, since a large-sized display requires millions of semiconductor light-emitting devices, it has difficulty in transferring the devices compared to other technologies.

Technologies currently in development for transfer processes include pick & place, laser lift-off (LLO), self-assembly, or the like. Among them, the self-assembly method, which is a method in which the semiconductor light-emitting device locates themselves in a fluid, is the most advantageous method for realizing a large-sized display device.

In recent years, U.S. Pat. No. 9,825,202 proposed a micro-LED structure suitable for self-assembly, but there is not yet research on technologies for fabricating a display through self-assembly of micro-LEDs. Accordingly, the present disclosure proposes a new type of manufacturing method and apparatus in which micro-LEDs can be self-assembled.

SUMMARY

An aspect of the present disclosure is to provide a new fabrication process with high reliability in a large-screen display using micro-sized semiconductor light-emitting devices.

Another aspect of the present disclosure is to provide a manufacturing process capable of improving transfer precision when self-assembling a semiconductor light-emitting device with a temporary substrate or a wiring substrate.

Still another aspect of the present disclosure is to provide a manufacturing process capable of effectively solving assembly defects generated during self-assembly.

The present disclosure may provide a self-assembly apparatus, including a fluid chamber provided with a space for accommodating a plurality of semiconductor light-emitting devices each having a magnetic body, a magnet that applies a magnetic force to the semiconductor light-emitting devices while a substrate is disposed at an assembly position, a power supply unit that induces the formation of an electric field on the substrate to allow the semiconductor light-emitting devices to be seated at a preset positions on the substrate in a process of moving the semiconductor light-emitting devices due to a change in the position of the magnet, and a fluid injector that injects fluid to some of the semiconductor light-emitting devices to allow the some semiconductor light-emitting devices seated on the substrate to be separated from the substrate.

In one embodiment, the substrate may be disposed in the fluid chamber to allow an assembly surface on which the semiconductor light-emitting devices are assembled to face downward.

In one embodiment, a light-transmitting bottom plate may be disposed in the fluid chamber, and the semiconductor light-emitting devices may be disposed between the bottom plate and the substrate.

In one embodiment, the self-assembly apparatus may further include a position adjusting unit that positionally moves the fluid injector between the assembly surface and the bottom plate.

In one embodiment, the self-assembly apparatus may further include an image sensor disposed to face the bottom plate so as to monitor an inside of the fluid chamber through the bottom plate.

In one embodiment, the fluid injector may include at least one hole to inject fluid toward the some semiconductor light-emitting devices.

In one embodiment, the fluid injected to the some semiconductor light-emitting devices may be water.

In one embodiment, the some semiconductor light-emitting devices may include semiconductor light-emitting devices that are not seated at the preset positions.

In one embodiment, the power supply unit may induce the formation of an electric field on the substrate to allow a first surface of the semiconductor light-emitting device to face the substrate.

In one embodiment, the some semiconductor light-emitting devices may include at least one of a semiconductor light-emitting device in which a second surface facing the first surface is disposed toward the substrate, and a light-emitting device in which the first surface is disposed at an angle to the substrate.

In addition, the present disclosure may provide a method of self-assembling semiconductor light-emitting devices, and the method may include transferring a substrate to an assembly position, and placing semiconductor light-emitting devices into a fluid chamber, applying a magnetic force to the semiconductor light-emitting devices to move the semiconductor light-emitting devices along one direction in the fluid chamber, applying an electric field to guide the semiconductor light-emitting devices to preset positions so as to allow the semiconductor light-emitting devices to be seated at the preset positions on the substrate during the movement of the semiconductor light-emitting devices, and injecting fluid to some of semiconductor light-emitting devices to allow the some semiconductor light-emitting devices seated on the substrate to be separated from the substrate, wherein the some semiconductor light-emitting devices comprise semiconductor light-emitting devices that are not seated at the preset positions.

In one embodiment, said injecting fluid to the some semiconductor light-emitting devices may include placing a fluid injector having at least one hole into the chamber, and transferring the fluid injector to allow the at least one hole to face the some semiconductor light-emitting devices, and then injecting the fluid.

In one embodiment, said guiding the semiconductor light-emitting devices to the preset positions may allow a first surface of the semiconductor light-emitting device to face a substrate.

In one embodiment, the some semiconductor light-emitting devices may include at least one of a semiconductor light-emitting device in which a second surface facing the first surface is disposed toward the substrate, and a light-emitting device in which the first surface is disposed at an angle to the substrate.

In one embodiment, the present disclosure may further include applying a magnetic force to the semiconductor light-emitting devices to allow the semiconductor light-emitting devices placed into the fluid chamber to move along one direction after performing said injecting fluid to the some semiconductor light-emitting devices, and applying an electric field to guide the semiconductor light-emitting devices to the preset positions.

According to the present disclosure having the foregoing configuration, a large number of semiconductor light-emitting devices may be assembled at one time in a display device in which individual pixels are formed with micro light emitting diodes.

As described above, according to the present disclosure, a large number of semiconductor light-emitting devices may be pixelated on a wafer having a small size, and then transferred onto a large-area substrate. Through this, it may be possible to fabricate a large-area display device at a low cost.

Furthermore, according to the manufacturing method and apparatus of the present disclosure, semiconductor light-emitting devices may be simultaneously transferred to exact positions using a magnetic field and an electric field in a solution, thereby allowing a low cost, high efficiency, and high-speed transfer implementation.

In addition, according to the manufacturing method and apparatus of the present disclosure, assembly defects generated during self-assembly may be eliminated, thereby significantly reducing the defect rate of a display device.

Moreover, according to the present disclosure, incorrectly assembled semiconductor light-emitting devices may be separated from a substrate by injecting fluid, thereby allowing the semiconductor light-emitting devices to be recycled without being damaged even though being separated from the substrate. Besides, according to the present disclosure, the fluid injected from a fluid injector may have little effect on the substrate, thereby causing no fear of damage to the substrate in the process of separating the semiconductor light-emitting devices from the substrate.

DETAILED DESCRIPTION OF THE EMBODIMENTS

Figure 1:
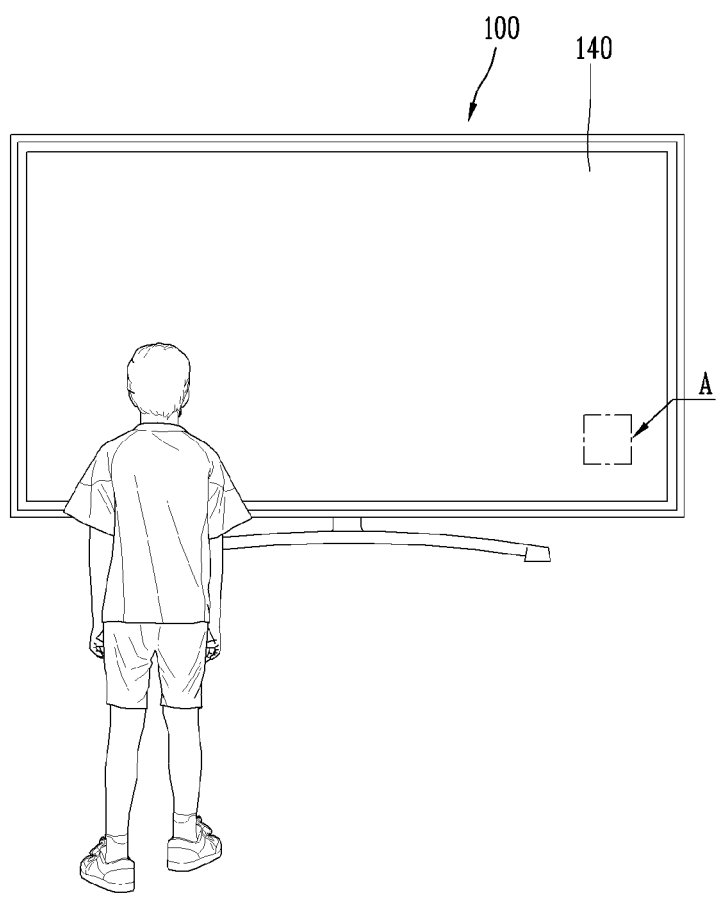
FIG. 1 is a conceptual view showing a display device using a semiconductor light-emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a digital signage, a head-mounted display (HMD), a desktop computer, and the like. However, it would be easily understood by those skilled in the art that a configuration disclosed herein may be applicable to any displayable device even though it is a new product type which will be developed later.

Figure 2:
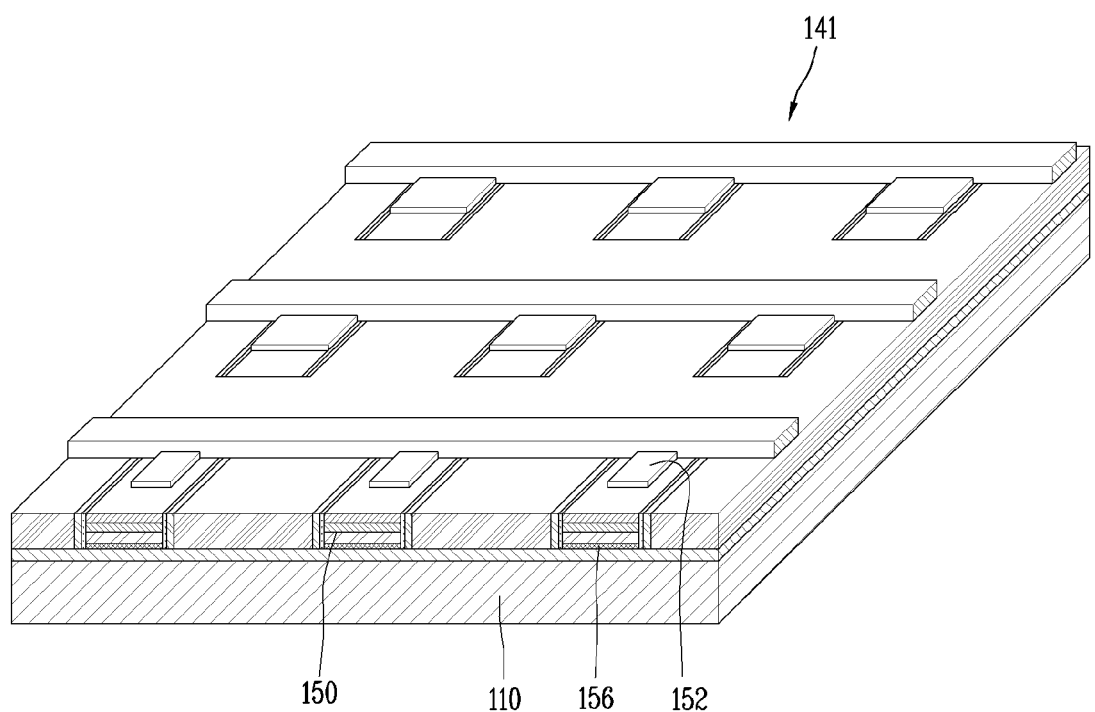
FIG. 2 is a partially enlarged view showing a portion "A" of the display device in FIG. 1.
Figure 3:
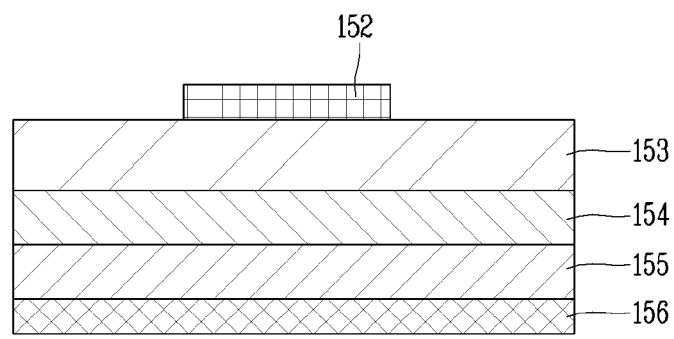
FIG. 3 is an enlarged view showing a semiconductor light-emitting device in FIG. 2.
Figure 4:
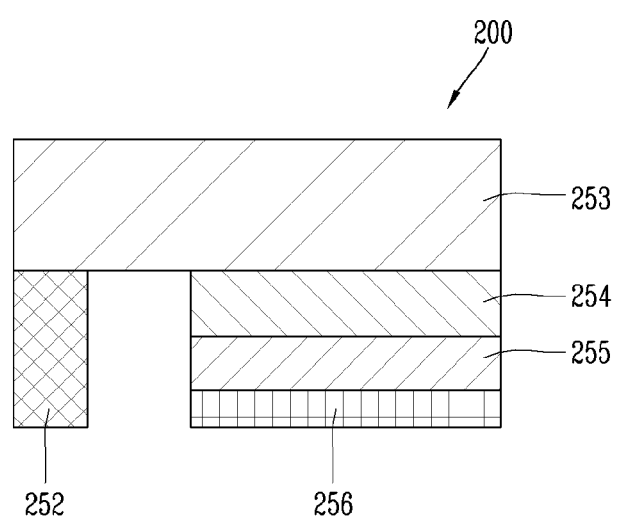
FIG. 4 is an enlarged view showing another embodiment of the semiconductor light-emitting device in FIG. 2.

FIG. 1 is a conceptual view showing a display device using a semiconductor light-emitting device according to an embodiment of the present disclosure, and FIG. 2 is a partially enlarged view showing a portion "A" of the display device in FIG. 1, and FIG. 3 is an enlarged view showing a semiconductor light-emitting device in FIG. 2, and FIG. 4 is an enlarged view showing another embodiment of the semiconductor light-emitting device in FIG. 2.

According to the illustration, information processed in the controller of the display device 100 may be displayed on a display module 140. A case 101 in the form of a closed loop surrounding an edge of the display module may form a bezel of the display device.

The display module 140 may include a panel 141 on which an image is displayed, and the panel 141 may include micro-sized semiconductor light-emitting devices 150 and a wiring substrate 110 on which the semiconductor light-emitting devices 150 are mounted.

Wiring lines may be formed on the wiring substrate 110, and connected to an n-type electrode 152 and a p-type electrode 156 of the semiconductor light-emitting device 150. Through this, the semiconductor light-emitting device 150 may be provided on the wiring substrate 110 as a self-emitting individual pixel.

An image displayed on the panel 141 is visual information, and implemented by independently controlling the light emission of sub-pixels arranged in a matrix form through the wiring lines.

According to the present disclosure, a micro-LED (Light Emitting Diode) is illustrated as one type of the semiconductor light-emitting device 150 that converts current into light. The micro-LED may be a light emitting diode formed with a small size of 100 microns or less. The semiconductor light-emitting device 150 may be provided in blue, red, and green light emitting regions, respectively, to implement a sub-pixel by a combination of the light emitting regions. In other words, the sub-pixel denotes a minimum unit for implementing a single color, and at least three micro-LEDs may be provided in the sub-pixel.

More specifically, referring to FIG. 3, the semiconductor light-emitting device 150 may be a vertical structure.

For example, the semiconductor light-emitting devices 150 may be implemented with a high-power light-emitting device that emits various lights including blue in which gallium nitride (GaN) is mostly used, and indium (In) and/or aluminum (Al) are added thereto.

The vertical semiconductor light-emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located at the bottom may be electrically connected to a p-electrode of the wiring substrate, and the n-type electrode 152 located at the top may be electrically connected to an n-electrode at an upper side of the semiconductor light-emitting device. The electrodes may be disposed in the upward/downward direction in the vertical semiconductor light-emitting device 150, thereby providing a great advantage capable of reducing the chip size.

For another example, referring to FIG. 4, the semiconductor light-emitting device may be a flip chip type semiconductor light-emitting device.

For such an example, the semiconductor light-emitting device 250 may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 disposed to be separated from the p-type electrode 256 in the horizontal direction on the n-type semiconductor layer 253. In this case, both the p-type electrode 256 and the n-type electrode 252 may be electrically connected to the p-electrode and the n-electrode of the wiring substrate at the bottom of the semiconductor light-emitting device.

The vertical semiconductor light-emitting device and the horizontal semiconductor light-emitting device may be a green semiconductor light-emitting device, a blue semiconductor light-emitting device, or a red semiconductor light-emitting device, respectively. The green semiconductor light-emitting device and the blue semiconductor light-emitting device may be mostly formed of gallium nitride (GaN), and indium (In) and/or aluminum (Al) may be added thereto to implement a high-power light-emitting device that emits green or blue light. For such an example, the semiconductor light-emitting device may be a gallium nitride thin-film formed in various layers such as n-Gan, p-Gan, AlGaN, and InGa, and specifically, the p-type semiconductor layer may be p-type GaN, and the n-type semiconductor layer may be N-type GaN. However, in case of the red semiconductor light-emitting device, the p-type semiconductor layer may be p-type GaAs and the n-type semiconductor layer may be n-type GaAs.

In addition, a p-electrode side in the p-type semiconductor layer may be p-type GaN doped with Mg, and an n-electrode side in the n-type semiconductor layer may be n-type GaN doped with Si. In this case, the above-described semiconductor light-emitting devices may be semiconductor light-emitting devices without an active layer.

On the other hand, referring to FIGS. 1 through 4, since the light emitting diode is very small, the display panel may be arranged with self-emitting sub-pixels arranged at fine pitch, thereby implementing a high-quality display device.

In a display device using the semiconductor light-emitting device of the present disclosure described above, a semiconductor light-emitting device grown on a wafer and formed through mesa and isolation is used as an individual pixel. In this case, the micro-sized semiconductor light-emitting device 150 must be transferred to a wafer at a preset position on the substrate of the display panel. Pick and place is used for the transfer technology, but the success rate is low and a lot of time is required. For another example, there is a technology of transferring a plurality of devices at one time using a stamp or a roll, but the yield is limited and not suitable for a large screen display. The present disclosure proposes a new fabrication method of a display device capable of solving the foregoing problems and a fabrication device using the same.

For this purpose, first, a new fabrication method of the display device will be described. FIGS. 5A through 5E are conceptual views for explaining a new process of manufacturing the foregoing semiconductor light-emitting device.

In this specification, a display device using a passive matrix (PM) semiconductor light-emitting device is illustrated. However, an example described below may also be applicable to an active-matrix (AM) type semiconductor light-emitting element. In addition, a method of self-assembling a horizontal semiconductor light-emitting device is illustrated, but it is also applicable to a method of self-assembling a vertical semiconductor light-emitting device.

First, according to a manufacturing method, a first conductive semiconductor layer 153, an active layer 154, and a second conductive semiconductor layer 155 are respectively grown on a growth substrate 159.

Figure 5A:
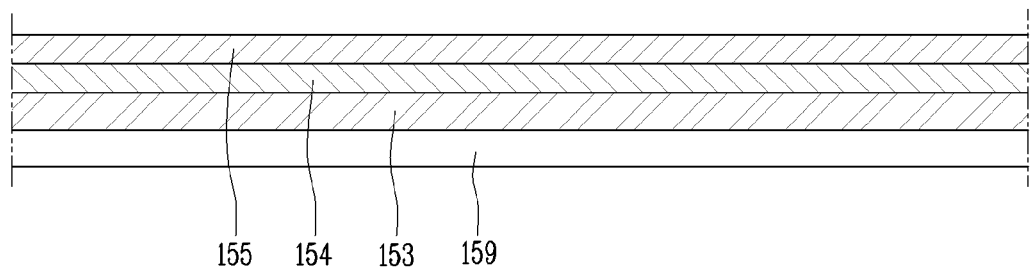
FIGS. 5A through 5E are conceptual views for explaining a new process of manufacturing the foregoing semiconductor light-emitting device.

When the first conductive semiconductor layer 153 is grown, next, the active layer 154 is grown on the first conductive semiconductor layer 153, and then the second conductive semiconductor layer 155 is grown on the active layer 154. As described above, when the first conductive semiconductor layer 153, the active layer 154 and the second conductive semiconductor layer 155 are sequentially grown, the first conductive semiconductor layer 153, the active layer 154, and the second conductive semiconductor layer 155 form a layer structure as illustrated in FIG. 5A.

In this case, the first conductive semiconductor layer 153 may be a p-type semiconductor layer, and the second conductive semiconductor layer 155 may be an n-type semiconductor layer. However, the present disclosure is not limited thereto, and the first conductive type may be n-type and the second conductive type may be p-type.

In addition, the present embodiment illustrates a case where the active layer is present, but it is also possible to adopt a structure in which the active layer is not present as described above. For such an example, the p-type semiconductor layer may be p-type GaN doped with Mg, and an n-electrode side in the n-type semiconductor layer may be n-type GaN doped with Si.

The growth substrate 159 (wafer) may be formed of any one of materials having light transmission properties, for example, sapphire ($Al_2O_3$), GaN, ZnO, and AlO, but is not limited thereto. Furthermore, the growth substrate 1059 may be formed of a carrier wafer, which is a material suitable for semiconductor material growth. The growth substrate (W) may be formed of a material having an excellent thermal conductivity, and for example, a SiC substrate having a higher thermal conductivity than a sapphire ($Al_2O_3$) substrate or a SiC substrate including at least one of Si, GaAs, GaP, InP and $Ga_2O_3$ may be used.

Figure 5B:
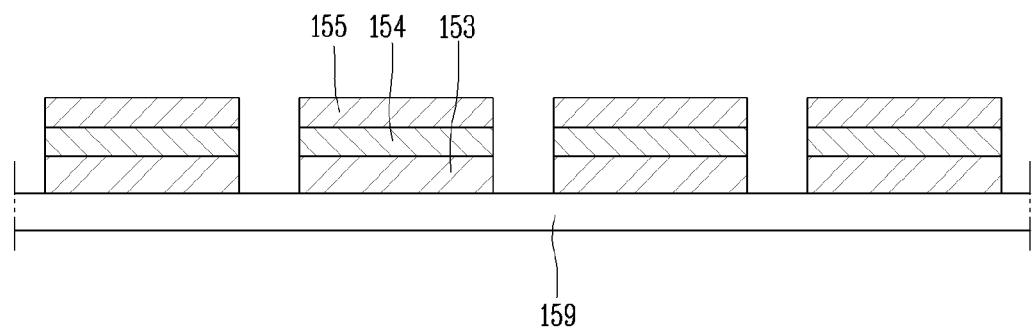

Next, at least part of the first conductive semiconductor layer 153, the active layer 154, and the second conductive semiconductor layer 155 is removed to form a plurality of semiconductor light-emitting devices (FIG. 5B).

More specifically, isolation is performed to allow a plurality of light-emitting devices form a light-emitting device array. In other words, the first conductive semiconductor layer 153, the active layer 154, and the second conductive semiconductor layer 155 are etched in a vertical direction to form a plurality of semiconductor light-emitting devices.

If it is a case of forming the horizontal semiconductor light-emitting device, then the active layer 154 and the second conductive semiconductor layer 155 may be partially removed in a vertical direction to perform a mesa process in which the first conductive semiconductor layer 153 is exposed to the outside, and then isolation in which the first conductive semiconductor layer is etched to form a plurality of semiconductor light-emitting device arrays.

Figure 5C:
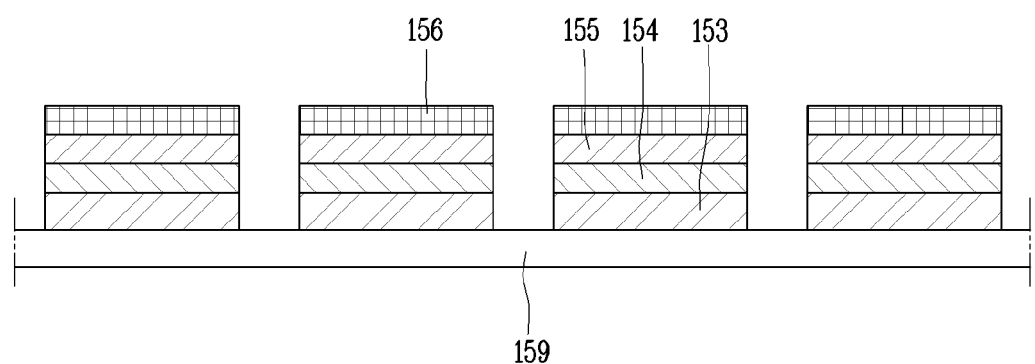

Next, a second conductive electrode 156 (or a p-type electrode) is respectively formed on one surface of the second conductive semiconductor layer 155 (FIG. 5C). The second conductive electrode 156 may be formed by a deposition process such as sputtering, but the present disclosure is not necessarily limited thereto. However, when the first conductive semiconductor layer and the second conductive semiconductor layer are an n-type semiconductor layer and a p-type semiconductor layer, respectively, the second conductive electrode 156 may also be an n-type electrode.

Figure 5D:
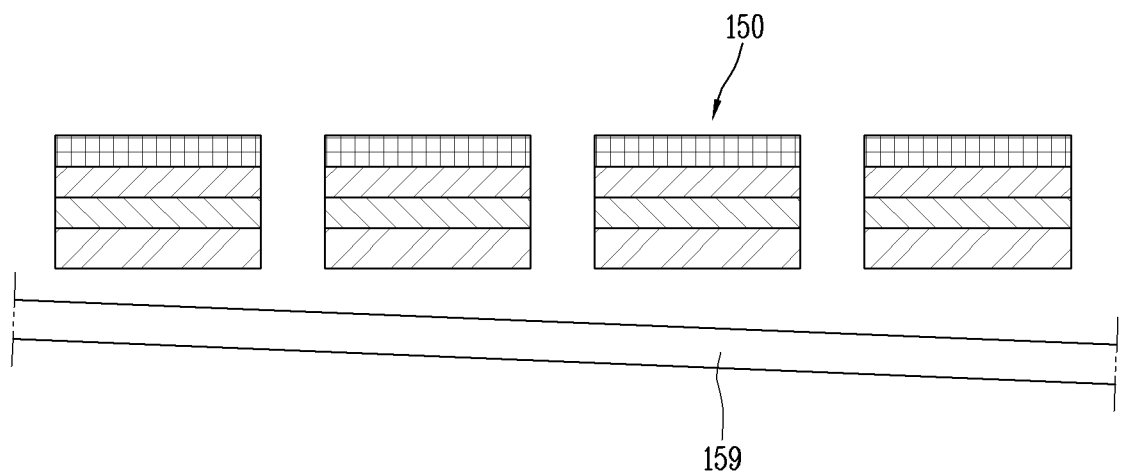

Then, the growth substrate 159 is removed to provide a plurality of semiconductor light-emitting devices. For example, the growth substrate 1059 may be removed using a laser lift-off (LLO) or chemical lift-off (CLO) method (FIG. 5D).

Figure 5E:
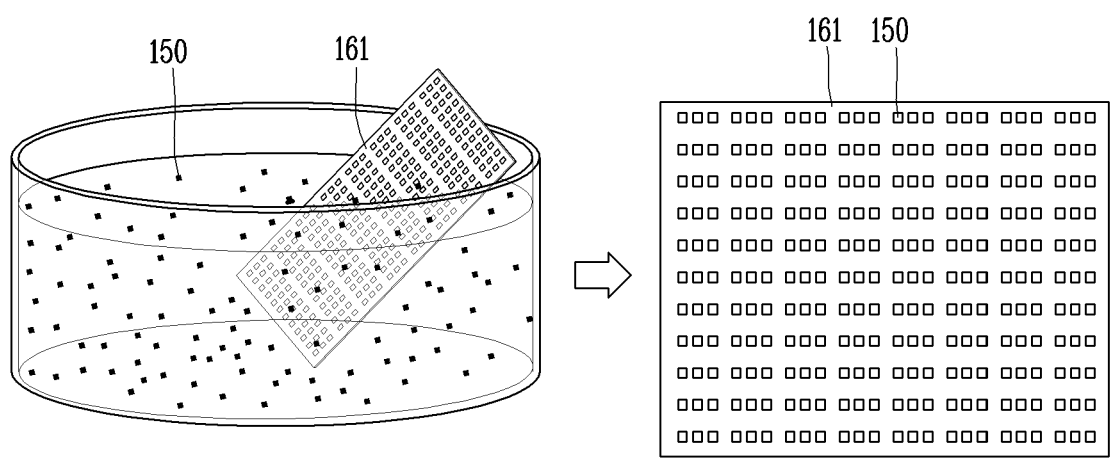

Then, the process of mounting the semiconductor light-emitting devices 150 on the substrate in a chamber filled with a fluid is carried out (FIG. 5E).

For example, the semiconductor light-emitting devices 150 and the substrate are placed in a chamber filled with a fluid, and the semiconductor light-emitting devices are assembled to the substrate 1061 by themselves using flow, gravity, surface tension, or the like. In this case, the substrate may be an assembly substrate 161.

For another example, the wiring substrate may also be placed in the fluid chamber instead of the assembly substrate 161 such that the semiconductor light emitting elements 150 are directly seated on the wiring substrate. In this case, the substrate can be a wiring substrate. However, for convenience of description, in the present disclosure, it is illustrated that the substrate is provided as an assembly substrate 161 and the semiconductor light emitting elements 1050 are seated thereon.

Cells (not shown) into which the semiconductor light-emitting devices 150 are fitted may be provided on the assembly substrate 161 so that the semiconductor light emitting elements 150 are easily seated on the assembly substrate 161. Specifically, cells on which the semiconductor light-emitting devices 150 are seated are formed on the assembly substrate 161 at a position where the semiconductor light-emitting devices 150 are aligned with the wiring electrode. The semiconductor light-emitting devices 150 are assembled into the cells while moving in the fluid.

When the plurality of semiconductor light-emitting devices are arrayed on the assembly substrate 161, and then the semiconductor light-emitting devices on the assembly substrate 161 are transferred to the wiring substrate, it may enable large-area transfer. Therefore, the assembly substrate 161 may be referred to as a temporary substrate.

Meanwhile, the self-assembly method described above must increase transfer yield when applied to the fabrication of a large-screen display. The present disclosure proposes a method and apparatus for minimizing the influence of gravity or friction and preventing non-specific binding in order to increase the transfer yield.

In this case, in a display device according to the present disclosure, a magnetic body is disposed on the semiconductor light-emitting device to move the semiconductor light-emitting device using a magnetic force, and place the semiconductor light-emitting device at a preset position using an electric field in the movement process. Hereinafter, such a transfer method and device will be described in more detail with reference to the accompanying drawings.

Figure 6:
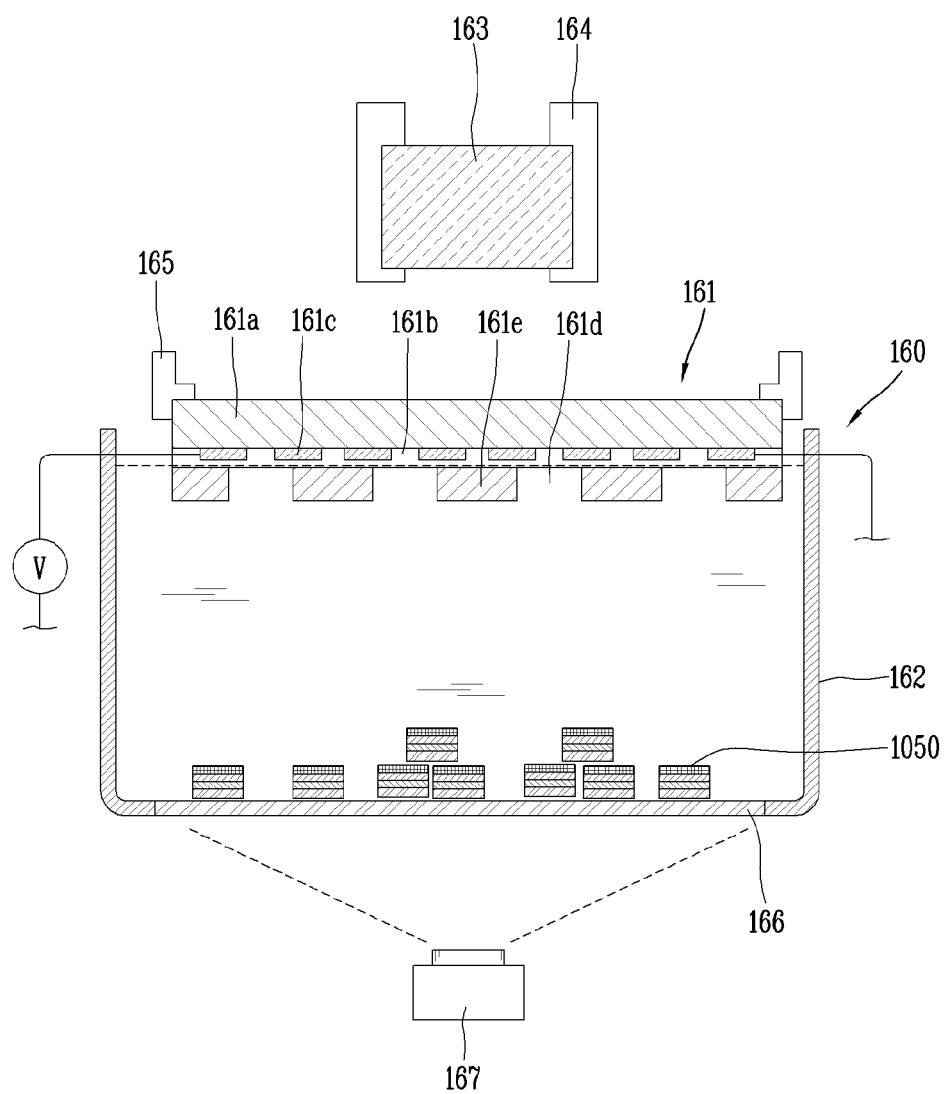
FIG. 6 is a conceptual view showing an example of a self-assembly apparatus of semiconductor light-emitting devices according to the present disclosure.
Figure 7:
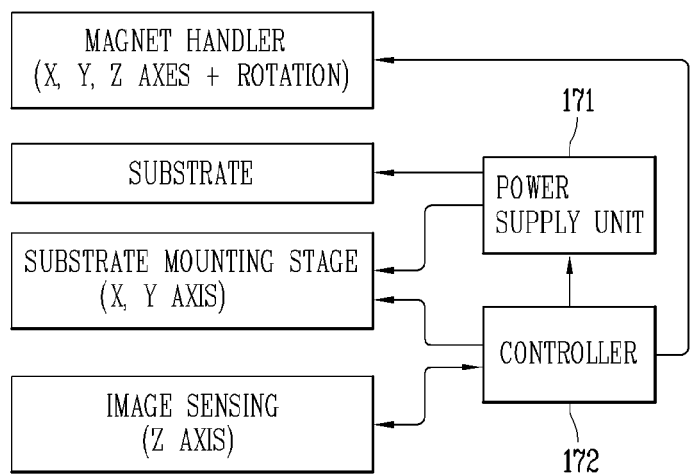
FIG. 7 is a block diagram showing the self-assembly apparatus in FIG. 6.

FIG. 6 is a conceptual view showing an example of a self-assembly apparatus of semiconductor light-emitting devices according to the present disclosure, and FIG. 7 is a block diagram showing the self-assembly apparatus in FIG. 6. FIGS. 8A through 8E are conceptual views showing a process of self-assembling semiconductor light-emitting devices using the self-assembly apparatus in FIG. 6, and FIG. 9 is a conceptual view for explaining the semiconductor light-emitting device in FIGS. 8A through 8E.

According to the illustration of FIGS. 6 and 7, a self-assembly apparatus 160 of the present disclosure may include a fluid chamber 162, a magnet 163, and a location controller 164.

The fluid chamber 162 has a space for accommodating a plurality of semiconductor light-emitting devices. The space may be filled with a fluid, and the fluid may include water or the like as an assembly solution. Accordingly, the fluid chamber 162 may be a water tank, and may be configured with an open type. However, the present disclosure is not limited thereto, and the fluid chamber 162 may be a closed type in which the space is formed with a closed space.

The substrate 161 may be disposed on the fluid chamber 162 such that an assembly surface on which the semiconductor light-emitting devices 150 are assembled faces downward. For example, the substrate 161 may be transferred to an assembly position by a transfer unit, and the transfer unit may include a stage 165 on which the substrate is mounted. The stage 165 is positioned by the controller, and the substrate 161 may be transferred to the assembly position through the stage 165.

At this time, the assembly surface of the substrate 161 faces the bottom of the fluid chamber 150 at the assembly position. According to the illustration, the assembly surface of the substrate 161 is disposed so as to be immersed in a fluid in the fluid chamber 162. Therefore, the semiconductor light-emitting devices 150 are moved to the assembly surface in the fluid.

The substrate 161, which is an assembly substrate on which an electric field can be formed, may include a base portion 161a, a dielectric layer 161b and a plurality of electrodes 161c.

The base portion 161a may be made of an insulating material, and the plurality of electrodes 161c may be a thin or a thick film bi-planar electrode patterned on one side of the base portion 161a. The electrode 161c may be formed of, for example, a laminate of Ti/Cu/Ti, an Ag paste, ITO, and the like.

The dielectric layer 161b is made of an inorganic material such as $SiO_2$, SiNx, SiON, $Al_2O_3$, $TiO_2$, $HfO_2$, or the like. Alternatively, the dielectric layer 161b may be composed of a single layer or multiple layers as an organic insulator. A thickness of the dielectric layer 161b may be several tens of nanometers to several micrometers.

Furthermore, the substrate 161 according to the present disclosure includes a plurality of cells 161d partitioned by partition walls. The cells 161d may be sequentially arranged along one direction, and made of a polymer material. In addition, the partition wall 161e constituting the cells 161d is configured to be shared with neighboring cells 161d. The partition walls 161e are protruded from the base portion 161a, and the cells 161d may be sequentially arranged along the one direction by the partition walls 161e. More specifically, the cells 161d are sequentially arranged in row and column directions, and may have a matrix structure.

As shown in the drawing, an inside of the cells 161d has a groove for accommodating the semiconductor light-emitting device 150, and the groove may be a space defined by the partition walls 161e. The shape of the groove may be the same as or similar to that of the semiconductor light-emitting device. For example, when the semiconductor light-emitting device is in a rectangular shape, the groove may be a rectangular shape. In addition, although not shown, when the semiconductor light-emitting device is circular, the grooves formed in the cells may be formed in a circular shape. Moreover, each of the cells is configured to accommodate a single semiconductor light-emitting device. In other words, a single semiconductor light-emitting device is accommodated in a single cell.

Meanwhile, the plurality of electrodes 161c include a plurality of electrode lines disposed at the bottom of each of the cells 161d, and the plurality of electrode lines may be configured to extend to neighboring cells.

The plurality of electrodes 161c are disposed below the cells 161d and applied with different polarities to generate an electric field in the cells 161d. In order to form the electric field, the dielectric layer may form the bottom of the cells 161d while the dielectric layer covers the plurality of electrodes 161c. In such a structure, when different polarities are applied to a pair of electrodes 161c from a lower side of each cell 161d, an electric field may be formed, and the semiconductor light-emitting device may be inserted into the cells 161d by the electric field.

At the assembly position, the electrodes of the substrate 161 are electrically connected to the power supply unit 171. The power supply unit 171 applies power to the plurality of electrodes to generate the electric field.

According to the illustration, the self-assembly apparatus may include a magnet 163 for applying a magnetic force to the semiconductor light-emitting emitting devices. The magnet 163 is spaced apart from the fluid chamber 162 to apply a magnetic force to the semiconductor light-emitting devices 150. The magnet 163 may be disposed to face an opposite side of the assembly surface of the substrate 161, and the location of the magnet is controlled by the location controller 164 connected to the magnet 163.

The semiconductor light-emitting device 1050 may have a magnetic body so as to move in the fluid by the magnetic field of the magnet 163.

Referring to FIG. 9, the semiconductor light-emitting device of the display device having a magnetic body may include a first conductive electrode 1052 and a second conductive electrode 1056, a first conductive semiconductor layer 1053 disposed with the first conductive electrode 1052, a second conductive semiconductor layer 1055 configured to overlap with the first conductive semiconductor layer 1052, and disposed with the second conductive electrode 1056, and an active layer 1054 disposed between the first and second conductive semiconductor layers 1053, 1055.

Here, the first conductive type and the second conductive type may be composed of p-type and n-type, and vice versa. In addition, as described above, it may be a semiconductor light-emitting device without having the active layer.

Meanwhile, in the present disclosure, the first conductive electrode 1052 may be generated after the semiconductor light-emitting device is assembled to the wiring board by the self-assembly of the semiconductor light-emitting device. In addition, in the present disclosure, the second conductive electrode 1056 may include the magnetic body. The magnetic body may refer to a metal having magnetism. The magnetic body may be Ni, SmCo or the like, and for another example, a material corresponding to at least one of Gd-based, La-based, and Mn-based materials.

The magnetic body may be provided in the second conductive electrode 1056 in the form of particles. Furthermore, alternatively, for a conductive electrode including a magnetic body, a single layer of the conductive electrode may be made of a magnetic body. For such an example, as illustrated in FIG. 9, the second conductive electrode 1056 of the semiconductor light-emitting device 1050 may include a first layer 1056a and a second layer 1056b. Here, the first layer 1056a may be made to include a magnetic material, and the second layer 1056b may include a metal material other than the magnetic material.

As illustrated, in this example, the first layer 1056a including a magnetic body may be disposed to be in contact with the second conductive semiconductor layer 1055. In this case, the first layer 1056a is disposed between the second layer 1056b and the second conductive semiconductor layer 1055. The second layer 1056b may be a contact metal connected to the second electrode of the wiring substrate. However, the present disclosure is not necessarily limited thereto, and the magnetic body may be disposed on one surface of the first conductive semiconductor layer.

Referring again to FIGS. 6 and 7, more specifically, the self-assembly apparatus may include a magnet handler that can be automatically or manually moved in the x, y, and z axes on the top of the fluid chamber or include a motor capable of rotating the magnet 163. The magnet handler and the motor may constitute the location controller 164. Through this, the magnet 163 rotates in a horizontal direction, a clockwise direction, or a counterclockwise direction with respect to the substrate 161.

On the other hand, a light transmitting bottom plate 166 may be formed in the fluid chamber 162, and the semiconductor light-emitting devices may be disposed between the bottom plate 166 and the substrate 161. An image sensor 167 may be positioned to view the bottom plate 166 so as to monitor an inside of the fluid chamber 162 through the bottom plate 166. The image sensor 167 is controlled by the controller 172, and may include an inverted type lens, a CCD, and the like to observe the assembly surface of the substrate 161.

The self-assembling apparatus described above is configured to use a combination of a magnetic field and an electric field, and using those fields, the semiconductor light-emitting devices may be placed at preset positions of the substrate by an electric field in the process of being moved by a location change of the magnet. Hereinafter, an assembly process using the self-assembly apparatus described above will be described in more detail.

First, a plurality of semiconductor light-emitting devices 1050 having magnetic bodies are formed through the process described with reference to FIGS. 5A through 5C. In this case, a magnetic body may be deposited on the semiconductor light-emitting device in the process of forming the second conductive electrode in FIG. 5C.

Figure 8A:
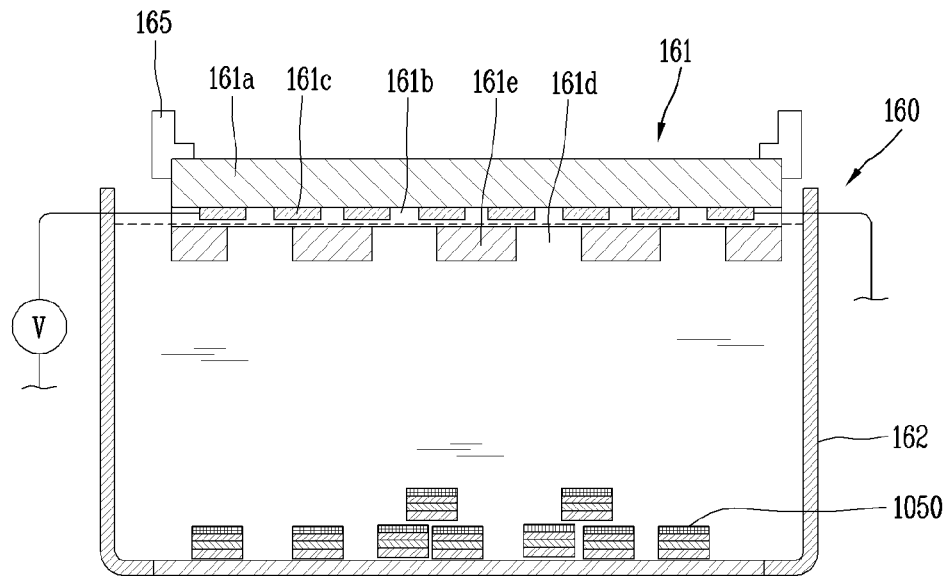
FIGS. 8A through 8E are conceptual views showing a process of self-assembling semiconductor light-emitting devices using the self-assembly apparatus in FIG. 6.
Figure 9:
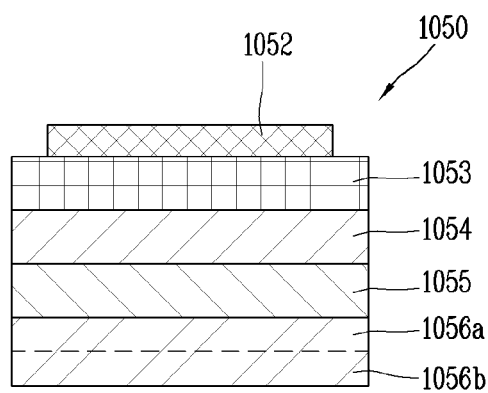
FIG. 9 is a conceptual view for explaining the semiconductor light-emitting device in FIGS. 8A through 8E.

Next, the substrate 161 is transferred to the assembly position, and the semiconductor light-emitting devices 1050 are placed into the fluid chamber 162 (FIG. 8A).

As described above, the assembly position of the substrate 161 is a position at which the assembly surface on which the semiconductor light-emitting devices 1050 of the substrate 161 are assembled is disposed in a downward direction in the fluid chamber 162.

In this case, some of the semiconductor light-emitting devices 1050 may sink to the bottom of the fluid chamber 162 and some may float in the fluid. When the light transmitting bottom plate 166 is provided in the fluid chamber 162, some of the semiconductor light-emitting devices 1050 may sink to the bottom plate 166.

Figure 8B:
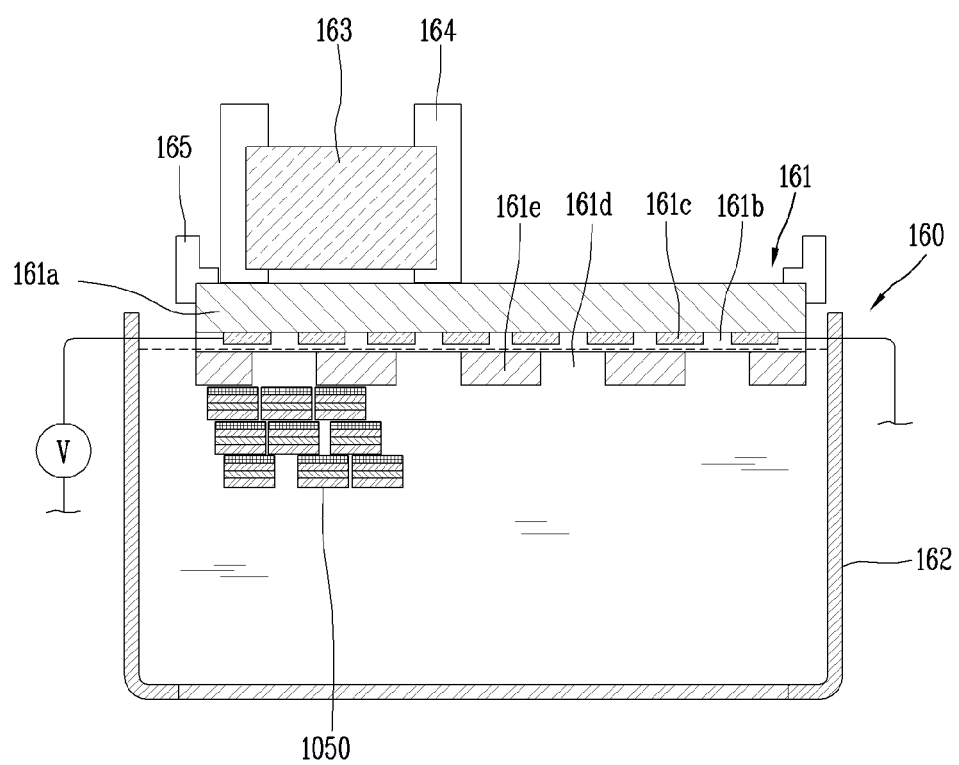

Next, a magnetic force is applied to the semiconductor light-emitting devices 1050 so that the semiconductor light-emitting devices 1050 float in the fluid chamber 162 in a vertical direction (FIG. 8B).

When the magnet 163 of the self-assembly apparatus moves from its original position to an opposite side of the assembly surface of the substrate 161, the semiconductor light-emitting devices 1050 float in the fluid toward the substrate 161. The original position may be a position away from the fluid chamber 162. For another example, the magnet 163 may be composed of an electromagnet. In this case, electricity is supplied to the electromagnet to generate an initial magnetic force.

Meanwhile, in this example, a separation distance between the assembly surface of the substrate 161 and the semiconductor light-emitting devices 1050 may be controlled by adjusting the magnitude of the magnetic force. For example, the separation distance is controlled using the weight, buoyancy, and magnetic force of the semiconductor light-emitting devices 1050. The separation distance may be several millimeters to tens of micrometers from the outermost edge of the substrate.

Figure 8C:
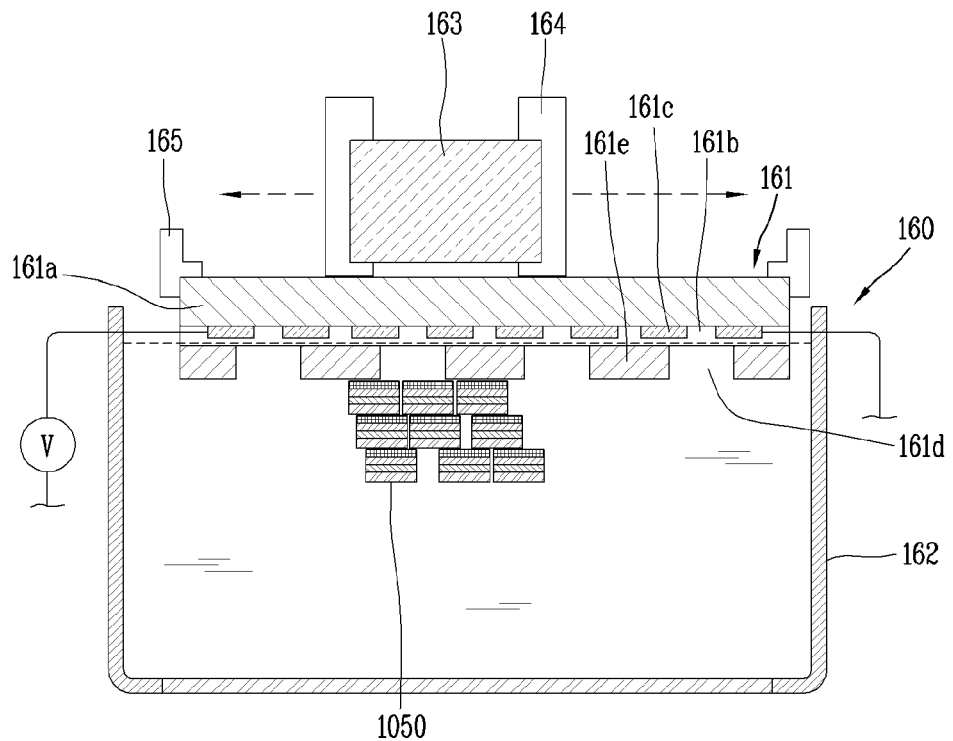

Next, a magnetic force is applied to the semiconductor light-emitting devices 1050 so that the semiconductor light-emitting devices 1050 move in one direction in the fluid chamber 162. For example, the magnet 163 moves in a horizontal direction, a clockwise direction or a counterclockwise direction with respect to the substrate (FIG. 8C). In this case, the semiconductor light-emitting devices 1050 move in a direction parallel to the substrate 161 at a position spaced apart from the substrate 161 by the magnetic force.

Next, the process of applying an electric field to guide the semiconductor light-emitting devices 1050 to preset positions of the substrate 161 so as to allow the semiconductor light-emitting devices 1050 to be placed at the preset positions during the movement of the semiconductor light-emitting devices 250 is carried out (FIG. 8C). For example, the semiconductor light-emitting devices 1050 move in a direction perpendicular to the substrate 161 by the electric field to be placed at preset positions of the substrate 161 while moving along a direction parallel to the substrate 161.

More specifically, electric power is supplied to a bi-planar electrode of the substrate 161 to generate an electric field to carry out assembly only at preset positions. In other words, the semiconductor light-emitting devices 1050 are assembled to the assembly position of the substrate 161 using a selectively generated electric field. For this purpose, the substrate 161 may include cells in which the semiconductor light-emitting devices 1050 are inserted.

Then, the unloading process of the substrate 161 is carried out, and the assembly process is completed. When the substrate 161 is an assembly substrate, a post-process of transferring the aligned semiconductor light-emitting devices to a wiring substrate as described above to implement a display device may be carried out.

Figure 8D:
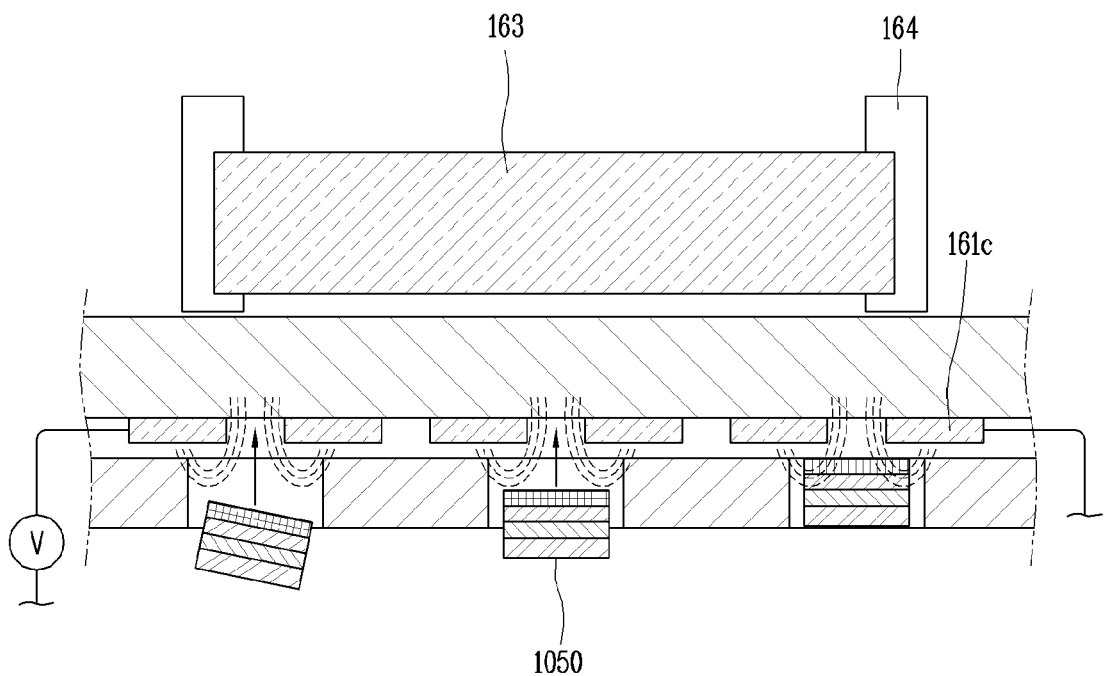

On the other hand, the semiconductor light-emitting devices 1050 may be guided to the preset positions, then the magnet 163 may move in a direction away from the substrate 161 such that the semiconductor light-emitting devices 1050 remaining in the fluid chambers 162 fall to the bottom of the fluid chambers 162, (FIG. 8D). For another example, if power supply is stopped when the magnet 163 is an electromagnet, then the semiconductor light-emitting devices 1050 remaining in the fluid chamber 162 fall to the bottom of the fluid chamber 162.

Then, when the semiconductor light-emitting devices 1050 on the bottom of the fluid chamber 162 are collected, the collected semiconductor light-emitting devices 1050 may be reused.

The above-described self-assembly apparatus and method are characterized in that, in order to increase the assembly yield in a fluidic assembly, parts at a far distance are concentrated adjacent to a preset assembly site using a magnetic field, and a separate electric field is applied to the assembly site to selectively assemble the parts only in the assembly site. At this time, the assembly substrate is placed on an upper portion of the water tank and the assembly surface faces downward, thereby preventing nonspecific coupling while minimizing the effect of gravity due to the weight of parts. In other words, in order to increase the transfer yield, the assembly substrate is placed on the top to minimize the effect of a gravitational or frictional force, and prevent nonspecific coupling.

As described above, according to the present disclosure having the foregoing configuration, a large number of semiconductor light-emitting devices may be assembled at one time in a display device in which individual pixels are formed with semiconductor light-emitting devices.

As described above, according to the present disclosure, a large number of semiconductor light-emitting devices may be pixelated on a wafer having a small size, and then transferred onto a large-area substrate. Through this, it may be possible to fabricate a large-area display device at a low cost.

Meanwhile, although the assembly accuracy of the foregoing self-assembly method is very high, the semiconductor light-emitting device may not be disposed at a preset position or may not be disposed in a designated orientation with a very low probability. In other words, assembly defects may occur with a very low probability during the self-assembly process.

In the case of a large-area display device, since millions or tens of millions of semiconductor light-emitting devices are transferred, the number of defective pixels becomes a level that cannot be ignored even though the probability of assembly defects is very low. For this reason, there is a need for a means capable of eliminating assembly defects after self-assembly.

The present disclosure provides an apparatus and method capable of eliminating assembly defects after self-assembly. The present disclosure further includes a fluid injector in the foregoing self-assembly apparatus.

First, the structure of a fluid injector will be described, but the structure to be described later is only an embodiment of the fluid injector according to the present disclosure, and does not limit the structure of the fluid injector.

Figure 10:
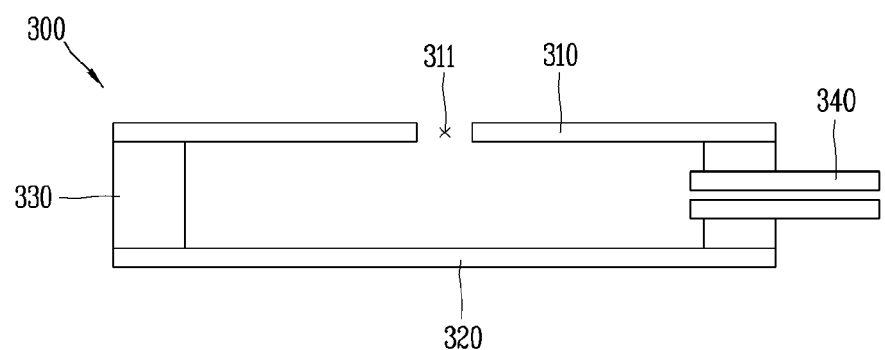
FIGS. 10 and 11 are cross-sectional views of a fluid injector according to an embodiment of the present disclosure.
Figure 11:
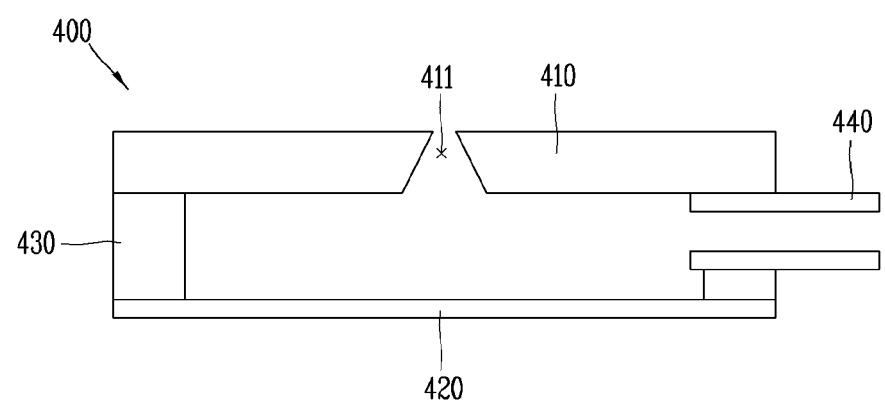
Figure 12:
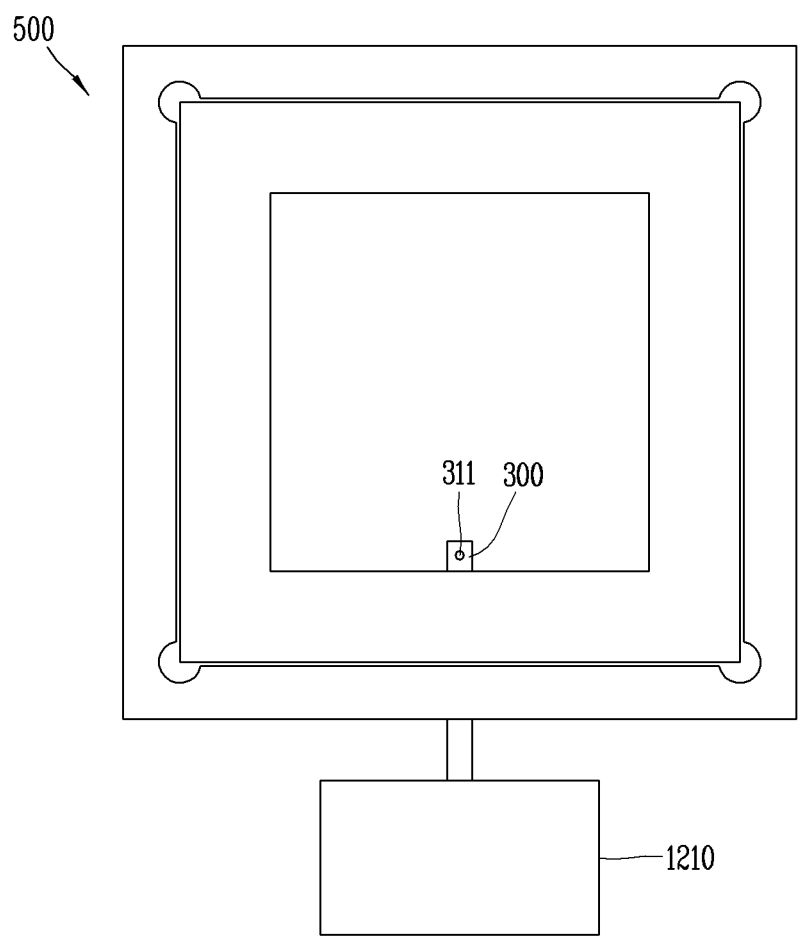
FIG. 12 is a conceptual view showing a state in which the fluid injector according to the present disclosure is viewed from a bottom plate of a fluid chamber.

FIGS. 10 and 11 are cross-sectional views of a fluid injector according to an embodiment of the present disclosure, and FIG. 12 is a conceptual view showing a state in which the fluid injector according to the present disclosure is viewed from a bottom plate of a fluid chamber.

Referring to FIG. 10, the fluid injector 300 may include an upper surface 310 and a lower surface 320, and may include a plurality of sidewalls 330. Meanwhile, at least one hole 311 may be disposed on the upper surface 310. Fluid is injected through the 311 hole. Referring to FIG. 11, the fluid injector 400 can include an upper surface 410 and a lower surface 420, and can include a plurality of sidewalls 430. Meanwhile, at least one hole 411 can be disposed on the upper surface 410. Fluid is injected through the hole 411.

Specifically, a fluid supply unit 340 provided in the fluid injector 300 supplies fluid to a space surrounded by the upper surface 310, the lower surface 320, and the sidewalls 330. Since the other portions except for the hole 311 are closed by the upper surface 310, the lower surface 320, and the sidewalls 330, the fluid is discharged to the outside through the hole 311. Here, the fluid is ejected in a direction toward the hole 311.

Here, an upper surface of the fluid injector may be made of glass as shown in FIG. 10 or made of a silicone material as shown in FIG. 11, but the present disclosure is not limited thereto.

The hole may be formed in one of a circular shape and a slit shape, but the present disclosure is not limited thereto.

When the fluid injector 300 is moved so that the hole 311 overlaps with the point where the fluid is to be injected, and then the fluid supply unit 340 supplies fluid, the fluid may be injected to an accurate position.

The fluid should be selectively injected onto any one of the semiconductor light-emitting devices assembled at intervals within 500 μm. For this reason, the size of the hole must be very small. Specifically, a diameter of the hole is preferably formed within several tens of μm. Meanwhile, a distance between the substrate and a bottom plate of the fluid chamber may be very small. In one embodiment, a distance between the substrate and the bottom plate may be 2 mm.

The fluid injector 300 must be able to move back and forth, left and right in the space. To this end, the present disclosure may further include a position adjusting unit 1210 to allow the fluid injector 300 to move between an assembly surface of the substrate and the bottom plate.

As shown in FIG. 12, when the bottom plate of the fluid chamber 500 is made of a light-transmitting material, the position of the fluid injector 300 may be checked in real time. Through this, the present disclosure may allow the position of the fluid injector 300 to be accurately adjusted. However, FIG. 12 is a view for a better understanding, and the hole provided in the fluid injector 300 is actually disposed not toward the bottom plate but toward the substrate.

Meanwhile, whether or not an assembly defect has occurred and a location of occurrence may be detected through a monitoring result of the image sensor. The position adjusting unit moves the position of the fluid injector so that the hole of the fluid injector faces the position where the assembly defect occurs.

The fluid may be the same material as the fluid in the fluid chamber, but is not limited thereto. In one embodiment, the fluid may be water.

After self-assembly, the fluid injector 300 is used to separate the semiconductor light-emitting devices in which assembly defects have occurred from the substrate among the semiconductor light-emitting devices mounted on the substrate. However, the semiconductor light-emitting device that is separated from the substrate by the fluid injector is not limited to the semiconductor light-emitting device in which an assembly defect has occurred. For example, some of the normally assembled semiconductor light-emitting devices, which are damaged, may also be separated from the substrate by the fluid injector.

Hereinafter, a description will be given of the type in which the assembly defect has occurred.

FIGS. 13A through 13D are conceptual views showing a type in which semiconductor light-emitting devices are seated on a substrate.

Figure 8E:
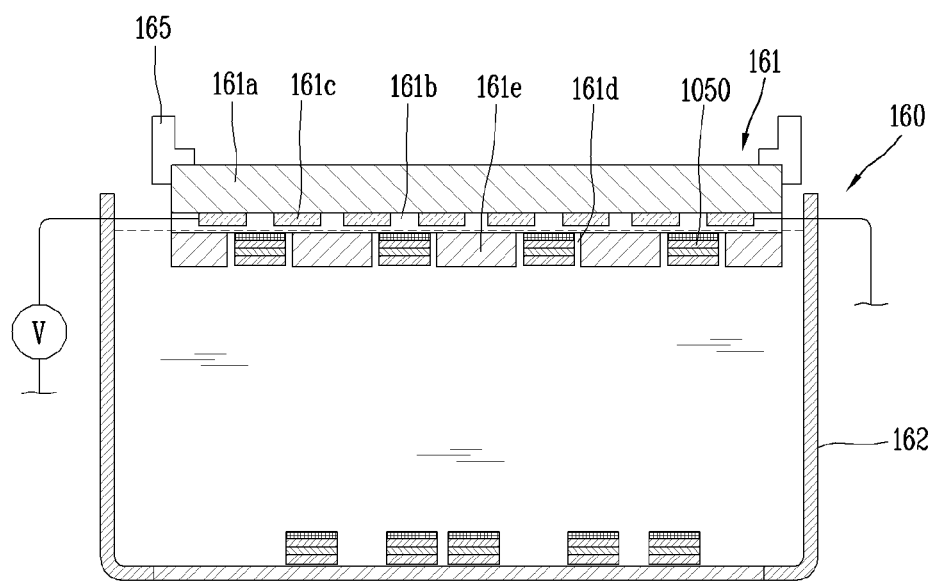

When the process described in FIG. 8E is completed, some of the semiconductor light-emitting devices injected into the fluid are seated on the substrate under the influence of a magnetic field formed in the substrate. In order not to cause assembly defects, the semiconductor light-emitting device must be seated at a preset position on the substrate, and a preset surface of the semiconductor light-emitting device must be disposed to face the substrate. In the present specification, one surface of the semiconductor light-emitting device to be disposed to face the substrate during self-assembly is referred to as a first surface. In contrast, a surface facing the first surface is referred to as a second surface.

Figure 13A:
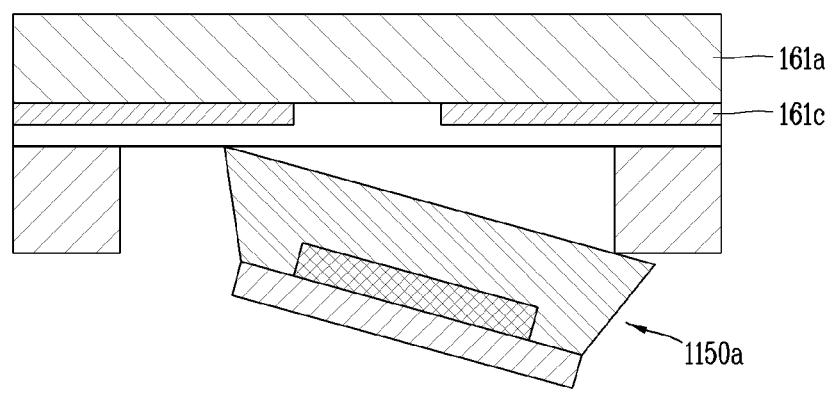
FIGS. 13A through 13D are conceptual views showing a type in which semiconductor light-emitting devices are seated on a substrate.

Referring to FIG. 13A, a first surface of a semiconductor light-emitting device 1150a mounted on a substrate may be disposed at an angle to an assembly surface of the substrate. In this case, it becomes difficult to form a wiring electrode for supplying power to the semiconductor light-emitting device 1150a. Furthermore, there is a high possibility that the semiconductor light-emitting device 1150a will be separated from the substrate in a subsequent process. Accordingly, the arrangement of the semiconductor light-emitting device according to FIG. 13A corresponds to a type of assembly defect.

Figure 13B:
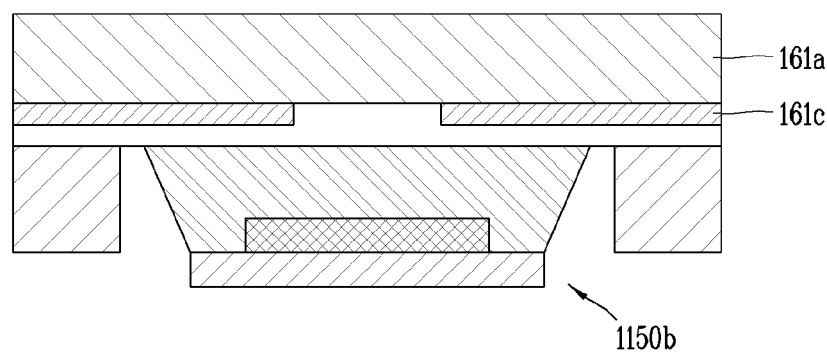

Meanwhile, referring to FIG. 13B, a semiconductor light-emitting device 1150b mounted on the substrate may be disposed at a preset position on the substrate, and a first surface of the semiconductor light-emitting device 1150b may be disposed to face the substrate. Accordingly, the arrangement of the semiconductor light-emitting device according to FIG. 13B corresponds to a normal arrangement. The semiconductor light-emitting device mounted on the substrate must have an arrangement as shown in FIG. 13B.

Figure 13C:
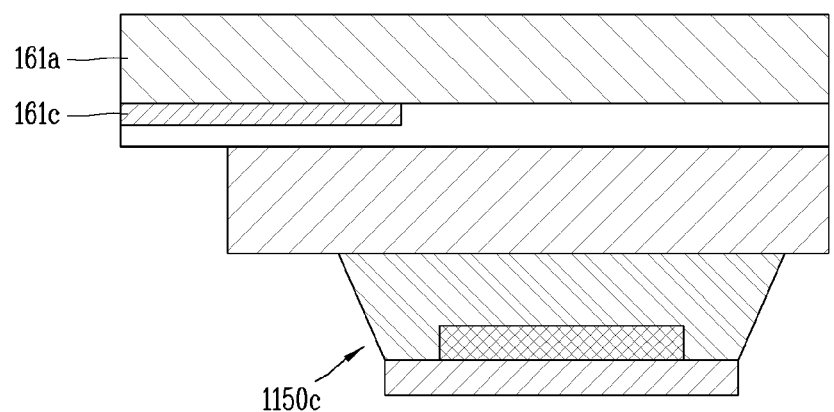

Meanwhile, referring to FIG. 13C, the semiconductor light-emitting device 1150c mounted on the substrate may not be disposed at a preset position on the substrate. In this case, it becomes difficult to form a wiring electrode for supplying power to the semiconductor light-emitting device 1150c, and it is difficult to form a pixel at a designated position. Accordingly, the arrangement of the semiconductor light-emitting device according to FIG. 13C corresponds to a type of assembly defect.

Figure 13D:
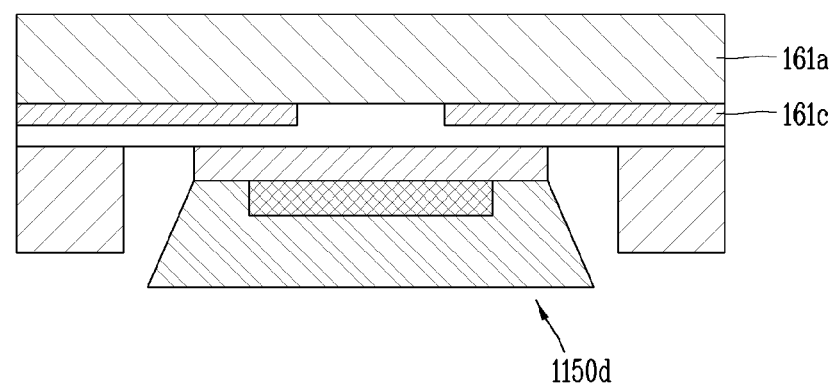

Finally, referring to FIG. 13D, a second surface of the semiconductor light-emitting device 1150d mounted on the substrate may be disposed to face the substrate. In this case, a wiring electrode cannot be connected to the semiconductor light-emitting device 1150d. Accordingly, the arrangement of the semiconductor light-emitting device according to FIG. 13D corresponds to a type of assembly defect.

As described above, various types of assembly defects may occur in the semiconductor light-emitting device mounted on the substrate. FIGS. 13A, 13C, and 13D illustrate an example of an assembly defect, and the drawings do not limit the type of assembly defect. Structures other than the structure described in FIG. 13B may be defined as assembly defects.

The fluid injector according to the present disclosure injects fluid onto a semiconductor light-emitting device in which an assembly defect has occurred to separate the semiconductor light-emitting device from the substrate.

Hereinafter, a method of self-assembling a semiconductor light-emitting device using the fluid injector will be described.

Figure 14A:
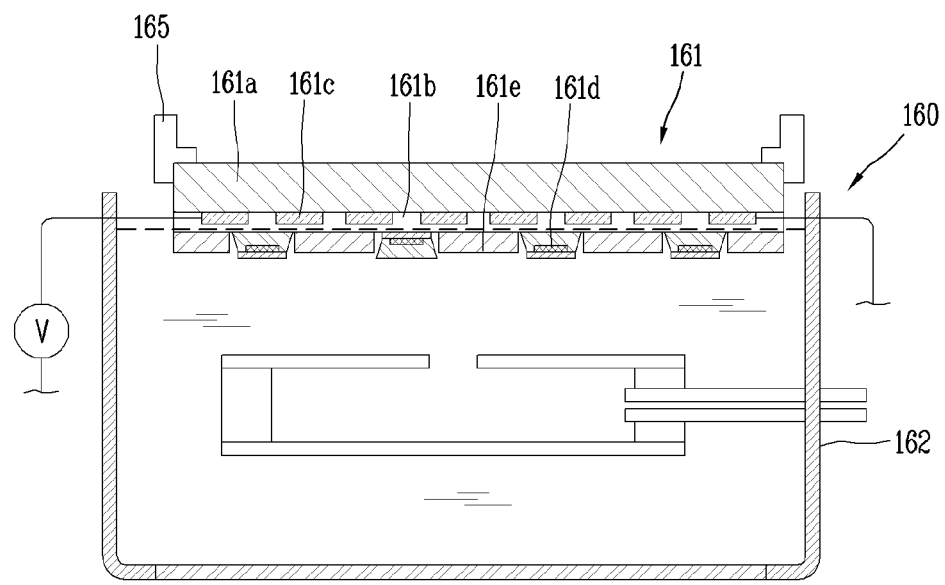
FIGS. 14A through 14C are conceptual views showing a self-assembly method using a fluid injector.
Figure 14B:
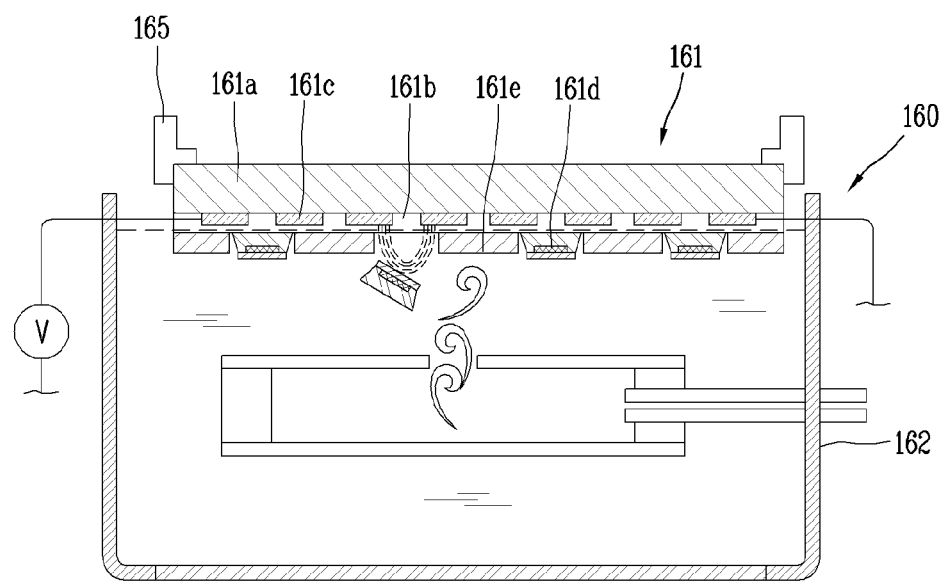
Figure 14C:
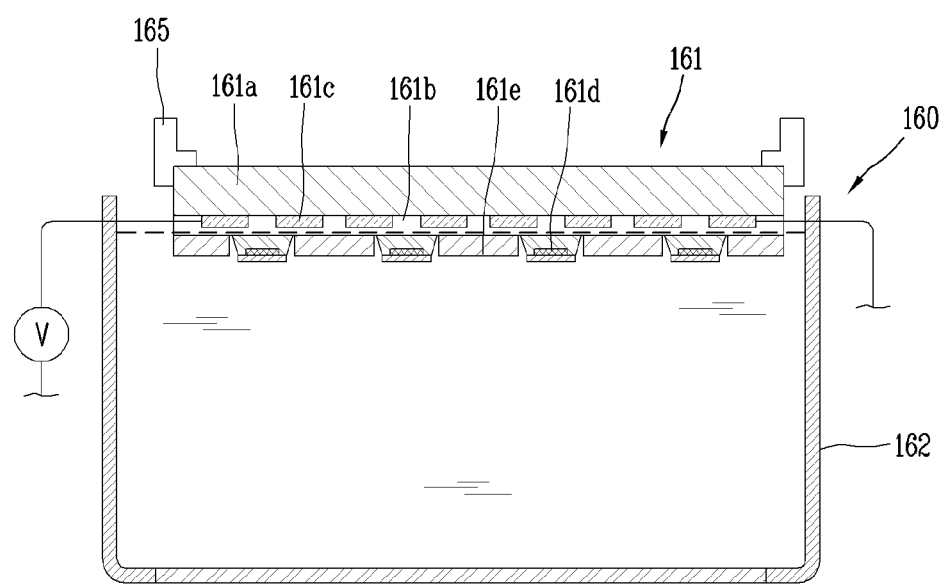

FIGS. 14A through 14C are conceptual views showing a self-assembly method using a fluid injector.

First, the self-assembly method described in FIGS. 8A through 8E will be performed.

Then, in order to separate some of the semiconductor light-emitting devices mounted on the substrate from the substrate, the process of injecting fluid onto the some of the semiconductor light-emitting devices is carried out.

Referring to FIG. 14A, after the self-assembly described in FIGS. 8A through 8E is finished, assembly defects may occur in some semiconductor light-emitting devices. The position adjusting unit moves the fluid injector so that the hole of the fluid injector overlaps with the semiconductor light-emitting device in which an assembly defect has occurred. However, the hole need not necessarily overlap with the semiconductor light-emitting device in which the assembly defect has occurred. The overlap need not be complete and a partial overlap is within the scope of the invention.

In a state in which the hole is sufficiently adjacent to the semiconductor light-emitting device in which the assembly defect has occurred, the process of injecting fluid through the hole is carried out. Here, care should be taken so that the ejected fluid does not affect the normally assembled semiconductor light-emitting devices.

The fluid injector may be used in a state in which an electric field is formed on the substrate. Accordingly, an electric force acts on the semiconductor light-emitting device mounted on the substrate. The fluid injector must inject, eject or shoot fluid at a pressure sufficient to offset the electric force. The fluid can be a jet, one or more pulses, a stream or any combination.

Meanwhile, some of the semiconductor light-emitting devices separated from the substrate by the fluid injector may be a semiconductor light-emitting device in which an assembly defect has occurred or a damaged semiconductor light-emitting device. As described in FIGS. 13A through 13D, the semiconductor light-emitting device in which an assembly defect has occurred may be at least one of a semiconductor light-emitting device that is not seated at a preset position, a semiconductor light-emitting device in which a second surface thereof is disposed to face the substrate, and a light-emitting device in which a first surface thereof is disposed at an angle to the substrate.

On the other hand, when the some semiconductor light-emitting devices are separated from the substrate, places where the some semiconductor light-emitting devices were seated remain as an empty spaces. The processes of FIGS. 8A through 8E may be performed once more so that new semiconductor light-emitting devices are seated in the empty spaces. As a result, as shown in FIG. 14C, all semiconductor light-emitting devices are disposed at preset positions with a preset orientation.

According to the present disclosure, incorrectly assembled semiconductor light-emitting devices may be separated from a substrate by injecting fluid, thereby allowing the semiconductor light-emitting devices to be recycled without being damaged even though being separated from the substrate. Besides, according to the present disclosure, the fluid injected from a fluid injector may have little effect on the substrate, thereby causing no fear of damage to the substrate in the process of separating the semiconductor light-emitting devices from the substrate.

What is claimed is:

1. A self-assembly apparatus, comprising:
   a fluid chamber configured to accommodate a plurality of semiconductor light-emitting devices, each semiconductor light-emitting device having a magnetic body;
   a magnet configured to apply a magnetic force to the plurality of semiconductor light-emitting devices while an assembly substrate is disposed at an assembly position of the self-assembly apparatus;
   a power supply configured to induce formation of an electric field on the assembly substrate to allow the plurality of semiconductor light-emitting devices to be seated at a preset positions on the assembly substrate in a process of moving the plurality of semiconductor light-emitting devices due to a change in a position of the magnet; and
   a fluid injector configured to shoot a fluid to some of the plurality of semiconductor light-emitting devices to allow the some of the plurality of semiconductor light-emitting devices seated on the assembly substrate to be separated from the assembly substrate,
   wherein the fluid injector comprises at least one hole oriented upwards in a direction opposite to gravity caused by a gravitational force of the earth and used to shoot the fluid upwards towards the some of the plurality of semiconductor light-emitting devices.

2. The self-assembly apparatus of claim 1, wherein the assembly substrate is disposed in the fluid chamber to allow an assembly surface on which the plurality of semiconductor light-emitting devices are assembled to face downward.

3. The self-assembly apparatus of claim 2, wherein a light-transmitting bottom plate is disposed in the fluid chamber, and the plurality of semiconductor light-emitting devices are disposed between the light-transmitting bottom plate and the assembly substrate.

4. The self-assembly apparatus of claim 3, further comprising:
a position adjuster that positionally moves the fluid injector between the assembly surface and the light-transmitting bottom plate.

5. The self-assembly apparatus of claim 3, further comprising:
an image sensor disposed to face the light-transmitting bottom plate so as to monitor an inside of the fluid chamber through the light-transmitting bottom plate.

6. The self-assembly apparatus of claim 1, wherein the power supply induces the formation of the electric field on the assembly substrate to allow a first surface of the plurality of semiconductor light-emitting device to face the assembly substrate.

7. The self-assembly apparatus of claim 6, wherein the some of the plurality of semiconductor light-emitting devices comprise at least one of a semiconductor light-emitting device in which a second surface facing the first surface is disposed towards the assembly substrate, and a light-emitting device in which the first surface is disposed at an angle to the assembly substrate.

8. The self-assembly apparatus of claim 1, wherein the fluid is water.

9. The self-assembly apparatus of claim 1, wherein the some of the plurality of semiconductor light-emitting devices comprise semiconductor light-emitting devices that are not seated at the preset positions.

10. The self-assembly apparatus of claim 1, wherein the magnet is located above the fluid chamber and the assembly substrate.

11. A method of self-assembling a plurality of semiconductor light-emitting devices, the method comprising:
Transferring an assembly substrate to an assembly position of a self-assembly apparatus, and placing the plurality of semiconductor light-emitting devices into a fluid chamber of the self-assembly apparatus;
applying a magnetic force to the plurality of semiconductor light-emitting devices to move the plurality of semiconductor light-emitting devices along one direction in the fluid chamber;
applying an electric field to guide the plurality of semiconductor light-emitting devices to preset positions of the assembly substrate so as to allow the plurality of semiconductor light-emitting devices to be seated at the preset positions on the assembly substrate during the movement of the plurality of semiconductor light-emitting devices; and
shooting a fluid to some of the plurality of semiconductor light-emitting devices to allow the some of the plurality of semiconductor light-emitting devices seated on the assembly substrate to be separated from the assembly substrate, when the some of the plurality of semiconductor light-emitting devices are not seated at the preset positions of the assembly substrate,
wherein the shooting of the fluid to the some of the plurality of semiconductor light-emitting devices comprises:
placing a fluid injector having at least one hole into the fluid chamber so that the least one hole is oriented upwards in a direction opposite to gravity caused by a gravitational force of the earth; and
transferring the fluid injector to allow the at least one hole to face the some the plurality of semiconductor light-emitting devices, and then shooting the fluid out the at least one hole upwards towards the some of the plurality of semiconductor light-emitting devices.

12. The method of claim 11, wherein the guiding of the plurality of semiconductor light-emitting devices to the preset positions allows a first surface of the semiconductor light-emitting device to face the assembly substrate.

13. The method of claim 12, wherein the some of the plurality of semiconductor light-emitting devices comprise at least one of a semiconductor light-emitting device in which a second surface facing the first surface is disposed toward the assembly substrate, and a light-emitting device in which the first surface is disposed at an angle to the assembly substrate.

14. The method of claim 11, further comprising:
applying the magnetic force again to the plurality of semiconductor light-emitting devices to allow the plurality of semiconductor light-emitting devices placed into the fluid chamber to move along the one direction after performing the shooting of the fluid to the some of the plurality of semiconductor light-emitting devices; and
applying the electric field again to guide the plurality of semiconductor light-emitting devices to the preset positions.

15. A self-assembly apparatus, comprising:
a fluid chamber configured to accommodate a plurality of semiconductor light-emitting devices immersed in a fluid;
a magnet configured to apply a magnetic force to the plurality of semiconductor light-emitting devices while an assembly substrate is disposed at an assembly position of the self-assembly apparatus;
a power supply configured to induce an electric field on the assembly substrate so that the plurality of semiconductor light-emitting devices are seated at a preset positions on the assembly substrate when the magnet is used to move the plurality of semiconductor light-emitting devices; and
a fluid injector configured to shoot the fluid to some of the plurality of semiconductor light-emitting devices to dislodge the some of the plurality of semiconductor light-emitting devices seated on the assembly substrate from the assembly substrate,
wherein the fluid injector comprises at least one hole oriented upwards in a direction opposite to gravity caused by a gravitational force of the earth and used to shoot the fluid upwards towards the some of the plurality of semiconductor light-emitting devices.

16. The self-assembly apparatus of claim 15, wherein the assembly substrate includes an assembly surface one which the plurality of semiconductor light-emitting devices are assembled, and
wherein the assembly surface faces downward.

17. The self-assembly apparatus of claim 15, wherein the fluid chamber includes a bottom plate that is transparent.

18. The self-assembly apparatus of claim 15, wherein the fluid is water.

19. A self-assembly apparatus, comprising:
a fluid chamber configured to accommodate a plurality of semiconductor light-emitting devices, each semiconductor light-emitting device having a magnetic body;

a magnet configured to apply a magnetic force to the plurality of semiconductor light-emitting devices while an assembly substrate is disposed at an assembly position of the self-assembly apparatus;

a power supply configured to induce formation of an electric field on the assembly substrate to allow the plurality of semiconductor light-emitting devices to be seated at a preset positions on the assembly substrate in a process of moving the plurality of semiconductor light-emitting devices due to a change in a position of the magnet; and a fluid injector configured to shoot a fluid to some of the plurality of semiconductor light-emitting devices to allow the some of the plurality of semiconductor light-emitting devices seated on the assembly substrate to be separated from the assembly substrate, wherein the assembly substrate is disposed in the fluid chamber to allow an assembly surface on which the plurality of semiconductor light-emitting devices are assembled to face downward, and wherein a light-transmitting bottom plate is disposed in the fluid chamber, and the plurality of semiconductor light-emitting devices are disposed between the light-transmitting bottom plate and the assembly substrate.

* * * * *